United States Patent [19]

Das

[11] 4,380,864

[45] Apr. 26, 1983

[54] METHOD FOR PROVIDING IN-SITU NON-DESTRUCTIVE MONITORING OF SEMICONDUCTORS DURING LASER ANNEALING PROCESS

[75] Inventor: Pankaj K. Das, Cohoes, N.Y.

[73] Assignee: The United States of America as represented by the Secretary of the Air Force, Washington, D.C.

[21] Appl. No.: 286,821

[22] Filed: Jul. 27, 1981

[51] Int. Cl.³ .................. H01L 21/268; H01L 21/263; G06G 7/195
[52] U.S. Cl. ...................................... 29/574; 148/1.5; 310/313 R; 364/821
[58] Field of Search .......................... 29/574, 589, 590; 310/313 R; 364/821, 861, 862; 148/1.5

[56] References Cited

U.S. PATENT DOCUMENTS

| | | | |
|---|---|---|---|
| 4,055,758 | 10/1977 | Stern et al. | 364/821 |
| 4,070,652 | 1/1978 | Heng et al. | 364/821 X |
| 4,101,965 | 7/1978 | Ingebrigtsen et al. | 310/313 R X |
| 4,124,828 | 11/1978 | Bert | 364/821 X |
| 4,233,573 | 11/1980 | Grudkowski | 310/313 R X |
| 4,259,726 | 3/1981 | Joly | 364/821 |

FOREIGN PATENT DOCUMENTS

WO80/00522  3/1980  PCT Int'L Appl. ................ 29/574

Primary Examiner—L. Dewayne Rutledge
Assistant Examiner—Alan E. Schiavelli
Attorney, Agent, or Firm—Donald J. Singer; Willard R. Matthews

[57] ABSTRACT

In-situ, non-destructive monitoring of semiconductors during laser annealing process is realized by a method the steps of which include: positioning a surface acoustic wave device adjacent to the semiconductor being annealed and in intercepting relationship with the annealing radiation, the surface acoustic wave device substrate being transparent to the annealing radiation; affixing an electrical contact to the top surface of the semiconductor; applying an r.f. input to the surface acoustic wave device; and measuring the transverse acousto-electrical voltage on the electrical contact. The surface acoustic wave propagation surface of the surface acoustic wave device is in close proximity to the bottom surface of the semiconductor and interaction of the electric field that accompanies the propagating surface acoustic wave with the charge carriers of the semiconductor produces the transverse acoustoelectric voltage. The transverse acoustoelectric voltage is thus a function of the semiconductor conductivity.

7 Claims, 7 Drawing Figures

METHOD FOR PROVIDING IN-SITU NON-DESTRUCTIVE MONITORING OF SEMICONDUCTORS DURING LASER ANNEALING PROCESS

STATEMENT OF GOVERNMENT INTEREST

The invention described herein may be manufactured and used by or for the Government for governmental purposes without the paymeny of any royalty thereon.

BACKGROUND OF THE INVENTION

This invention relates to non-destructive testing methods and techniques and in particular to non-destructive, in situ-monitoring of semiconductors during laser annealing process.

Impurities introduced into a semiconductor sample by ion-implantation produce damage in the crystal which must subsequently be removed by thermal treatment in a furnace or by laser annealing. The annealing serves to incorporate the implanted ions into electrically active sites and to reduce defect traps to the point where carrier lifetimes and mobilities have useful values. In order to ascertain that impurity activation has been achieved, the technique commonly used consists of the fabrication and characterization of a MOSFET or a MOS capacitor. The turn-on or inversion voltage of these devices or the channel conductance of the FET at pre-set voltage levels can be used as measures of impurity activation. However, these techniques are destructive in that several wafer processing steps are needed for the fabrication of the test structures; as a result, after the test for implant activation, the wafer cannot be used for making useful devices.

Accordingly, there currently exists the need for a non-destructive and rapid method of monitoring the adequacy of the thermal cycle during semiconductor wafer processing. Such a method is highly desirable since the wafer could either be qualified for use in device fabrication or be further annealed. The present invention is directed toward providing such a method.

SUMMARY OF THE INVENTION

The method of the invention provides for non-destructive, in-situ monitoring of semiconductors during laser annealing process. A surface acoustic wave device, the substrate of which is transparent to annealing radiation is placed with its surface acoustic wave propagating surface in close adjacent proximity to one surface of the semiconductor being annealed such that the annealing radiation passes through the surface acoustic wave substrate. An electrical contact is affixed to the opposite surface of the semiconductor. The surface acoustic wave device is energized with an r.f. input. Interaction of the electronic field that accompanies the propagating surface acoustic wave with the charge carriers of the semiconductor produces a transverse acoustoelectric voltage. The transverse acoustoelectric voltage is detected on the electrical contact and is measured as a function of the semiconductor conductivity.

It is a principal object of the invention to provide a method of monitoring semiconductors during laser annealing process.

It is another object of the invention to provide an improved in-situ, non-destructive method of monitoring semiconductors during laser annealing process.

It is another object of the invention to provide a non-destructive and rapid method of monitoring the adequacy of the thermal cycle during semiconductor wafer processing.

These together with other objects, features and advantages of the invention will become more readily apparent from the following detailed description taken in conjunction with the illustrative embodiment in the accompanying drawings.

DETAILED DESCRIPTION OF THE PREFERRED EMBODIMENT

The present invention comprehends a contactless technique of determining electrical properties of a semiconductor surface during annealing process using surface acoustic waves as a probe. The surface acoustic wave semiconductor probing technique relies on the interaction of the electric field which accompanies a surface acoustic wave propagating on a piezoelectric substrate with the charge carriers of a semiconductor placed near the substrate.

The electric field associated with the surface acoustic wave is confined near the surface and exists both inside and outside the crystal. The decay constant of the electric field outside the surface is of the order of the surface acoustic wave wave-length. When a semiconductor sample is placed in the proximity of a surface acoustic wave piezoelectric substrate, this decaying electric field interacts with the carriers in the semiconductor. Inside the semiconductor, the electric field decays within a Debye length of the surface or within an acoustic wavelength, whichever is shorter. Within this region the free carriers absorb energy from the surface acoustic wave resulting in attenuation of the surface acoustic wave and producing the transverse acoustoelectric voltage. Each of these effects is dependent on semiconductor conductivity and surface conditions. By observing the variation of these parameters while the semiconductor conductivity is changed by illumination or by a biasing electric field, electrical characteristics of the semiconductor can be determined.

Figure 1:
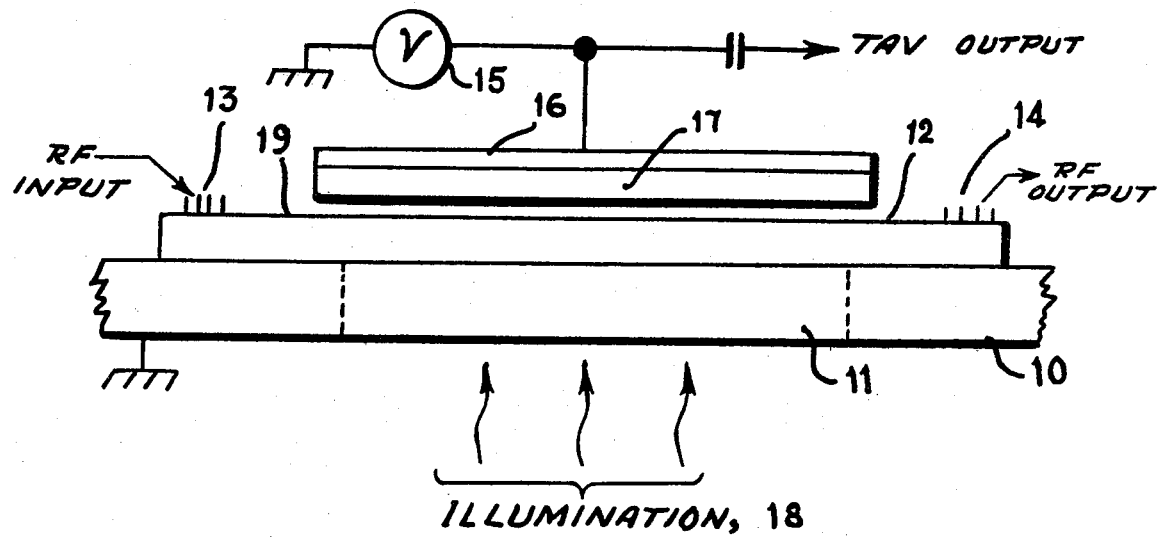
FIG. 1 is a side view showing the mechanization of a semiconductor laser annealing process in accordance with the in-situ, non-destructive monitoring method of the invention.
Figure 2:
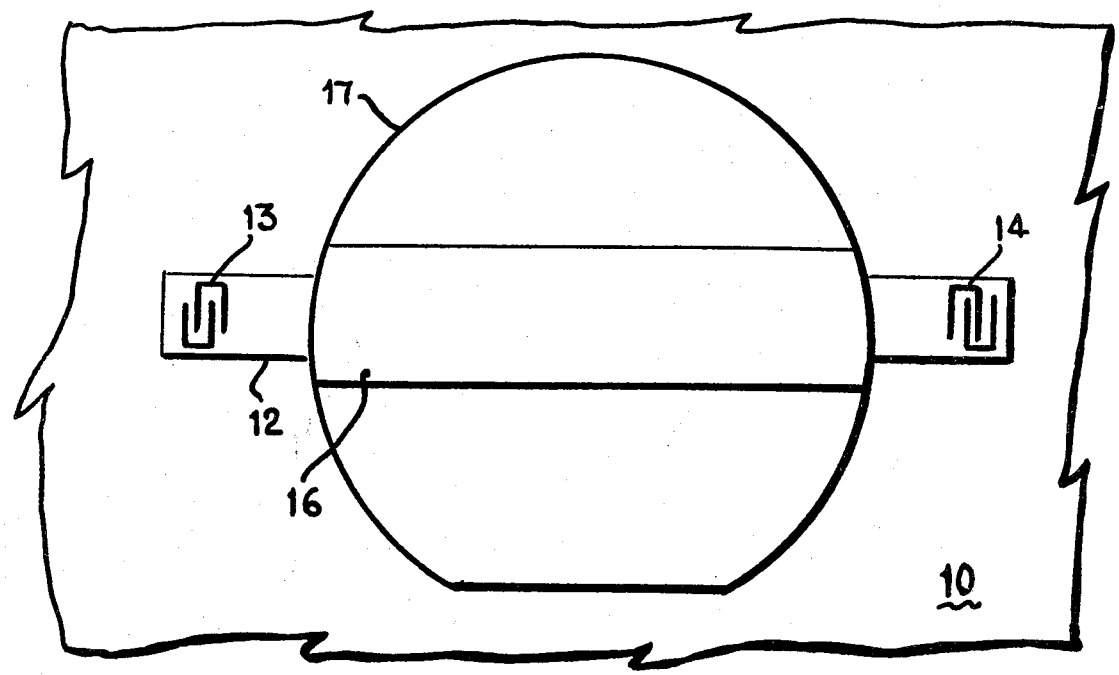
FIG. 2 is a plan view of the mechanization of the laser annealing process of FIG. 1.
Figure 3:
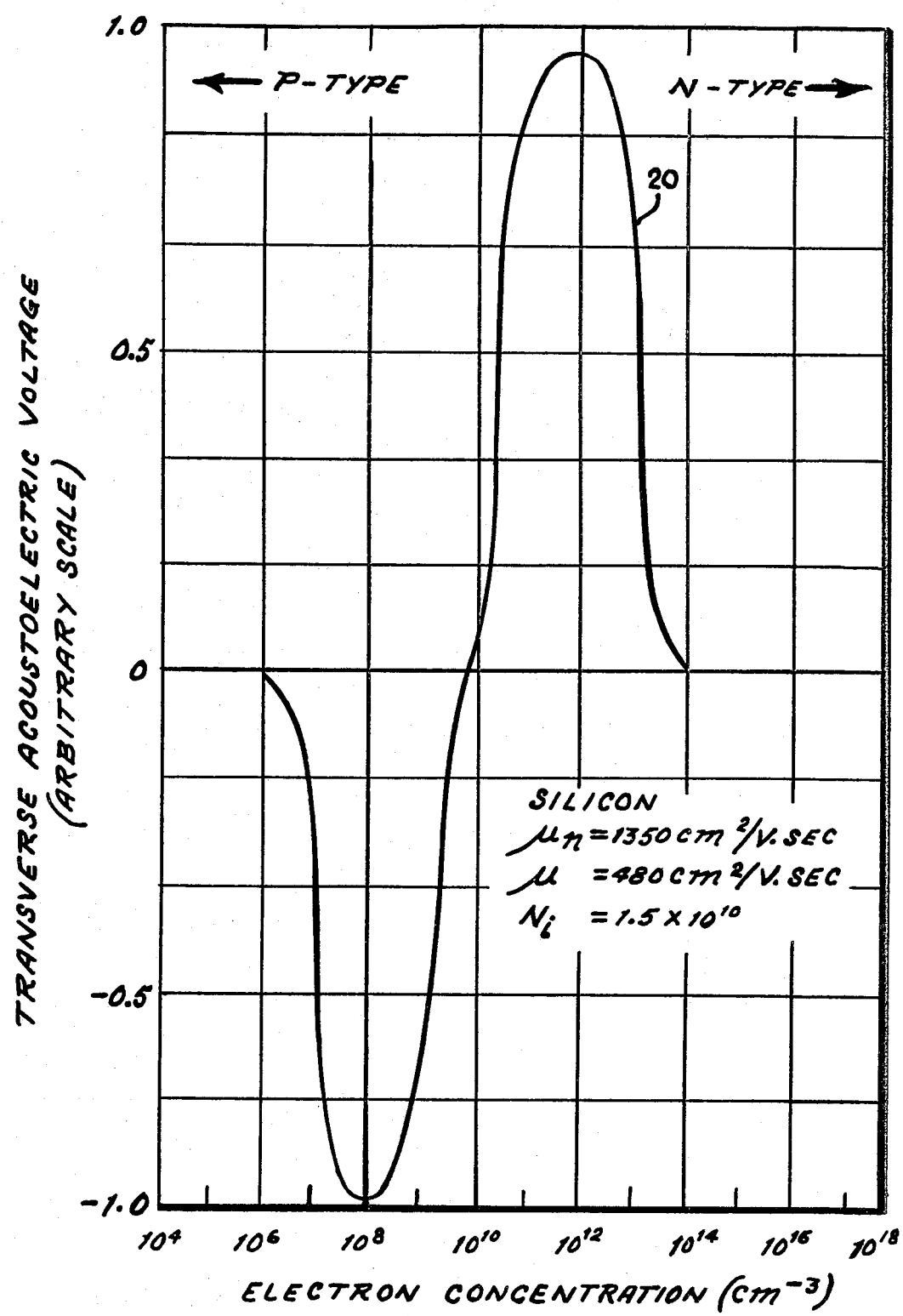
FIG. 3 is a graph illustrating transverse acoustoelectric voltage values for silicon as a function of electron concentrations.

Implementation of the method of the invention can be realized by the mechanization shown in FIGS. 1 and 2. The semiconductor annealing process can be conducted using a stand or support facility 10, which can be an aluminum box, for example, with an aperture 11 that permits the passage of illumination 18 to the semiconductor 17 being processed. Illumination 18 can be any appropriate radiation such as white or monochromatic radiation supplied by a laser or other source (not shown). A surface acoustic wave device comprising substrate 12 and input and output transducers 13 and 14 respectively is positioned with its surface acoustic wave propagating surface adjacent the bottom surface of semiconductor 17 as shown. An electrical contact 16, which can be aluminum plate permits the applying of a bias voltage to the semiconductor 17 from voltage source 15 and also permits detection of transverse acoustoelectric voltage for measurement and processing and for display on an oscilloscope (not shown). In operation, the surface acoustic wave is generated by a 110 MHz rf pulse applied to the input transducer 13 of substrate 12, which can be fabricated, for example, of Y-cut Z-propagating lithium-niobate ($LiNbO_3$). The semiconductor wafer 17 is placed in the proximity of the $LiNbO_3$ substrate 12 as shown. Electrical contact is made at the back of the semiconductor with metal plate 16. As indicated above this metal contact allows monitoring of the transverse component of the acoustoelectric voltage and can also be used to bias the semiconductor surface. Provision is made to illuminate the semiconductor surface with white or monochromatic radiation 18 in the manner described. For the non-destructive monitoring of impurity activation in ion-implanted silicon, the transverse acoustoelectric voltage, which is a function of semiconductor conductivity, is measured. If an ion-implanted layer extends over the surface acoustic wave interaction depth, the observed transverse acoustoelectric voltage depends primarily on characteristics of the implanted layer and not of the substrate.

pendence of the transverse acoustoelectric voltage on the conductivity of silicon has been calculated and is shown by curve 20 of FIG. 3.

Figure 4:
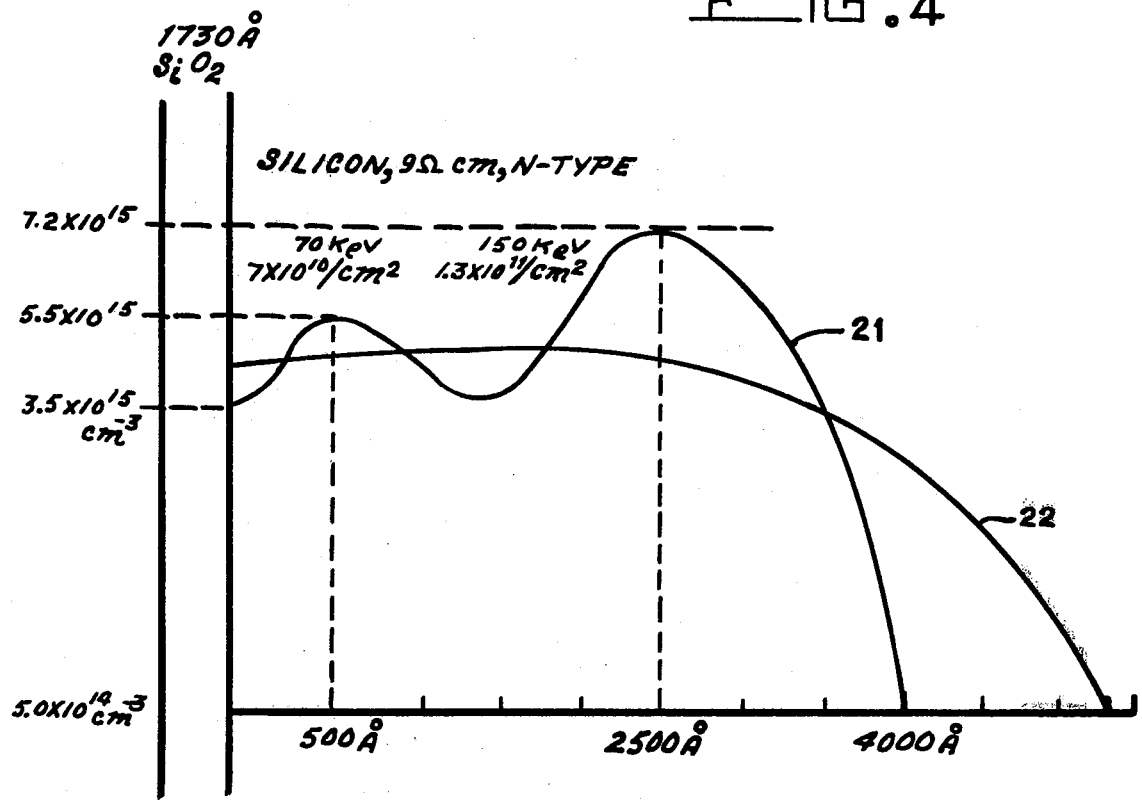
FIG. 4 is a graph illustrating the doping distribution of boron implanted through $SiO_2$ into n-type silicon.

By way of example, the method of the invention was used to monitor the effects of annealing on boron-implanted silicon wafers. The boron-implanted silicon wafers tested has been subjected to various annealing treatments. The starting material in each case was an n-type wafer, phosphorus doped to (nominally) 9 Ohm-cm; and with 100 surface orientation. Boron ions were implanted through a 1730 A thick layer of silicon dioxide into the wafers. The implant schedule was chosen to ensure that the surface acoustic wave interaction occurred primarily with the implanted layer. The expected doping distribution (based on standard tabulation data on range and straggle) is shown schematically in FIG. 4 prior to anneal by curve 21 and for the case of 30 minutes, annealing at 1000° C. in $N_2$ gas by curve 22.

Figure 5:
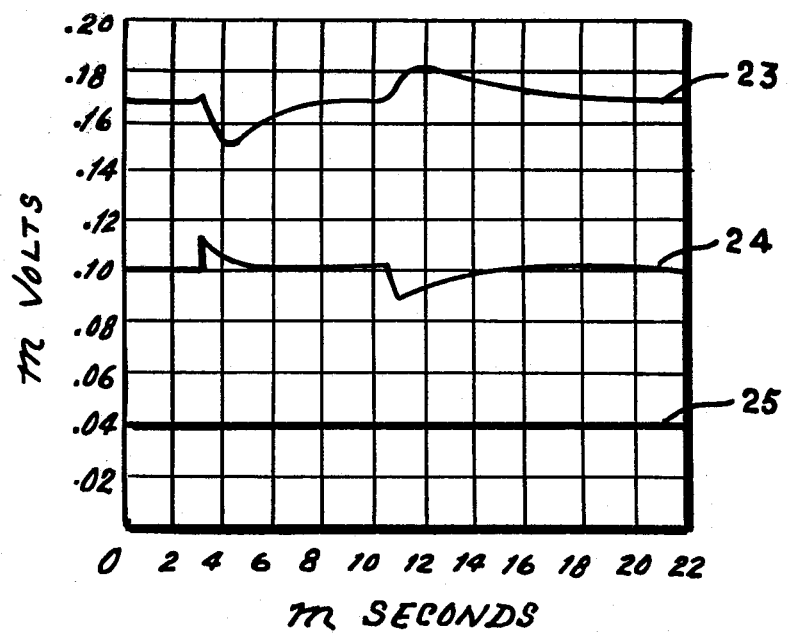
FIG. 5 is an oscilloscope display of transverse acoustoelectric voltage for a given annealed sample semiconductor wafer.

Transverse acoustoelectric voltage measurements were conducted on four types of samples: (1) unimplanted silicon, (2) implanted but not annealed, (3) implanted and annealed at 1000° C. for 30 minutes in $N_2$ gas, (4) implanted and annealed at 1000° C. for 120 minutes in $N_2$ gas and steam. FIG. 5 shows a set of transverse acoustoelectric voltage waveforms obtained for the annealed sample 3. For trace 23 the implanted surface was in the dark, and for trace 24 it was illuminated by white light. It should be mentioned that the transverse acoustoelectric voltage appears as a transient voltage due to the lack of a dc path.

The peak transverse acoustoelectric voltage values and polarities obtained for the various samples are summarized in Table I.

TABLE I

SUMMARY OF TAV DATA

| SAMPLE TYPE | IMPLANT | ANNEAL | TAV PEAK VALUE (mV) DARK | TAV PEAK VALUE (mV) WHITE LIGHT | SENSITIVITY TO BIAS | MAJORITY CARRIER TYPE IN INTERACTION REGION (DARK) |
|---|---|---|---|---|---|---|
| 1 | NO | NO | +0.08 | +0.12 | YES | N |
| 2 | YES | NO | +0.30 | +0.27 | NO | N |
| 3 | YES | 1000° C., 30 MIN. IN $N_2$ | 1.5 | −1.4 | YES | P |
| 4 | YES | 1000° C. 120 MIN. IN $N_2$ + STEAM | −0.2 | −0.2 | YES | P |

Figure 6:
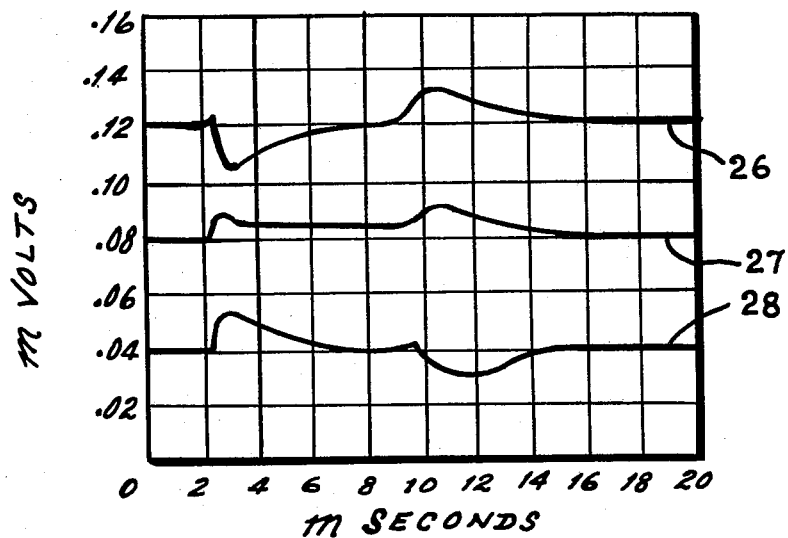
FIG. 6 is an oscilloscope display showing the effect of monochromatic illumination on transverse acoustoelectric voltage in the annealed sample of FIG. 5; and, FIG. 7 is a graph showing the effect of bias voltage on transverse acoustoelectric for the annealed sample of FIG. 5.

The dependence of transverse acoustoelectric voltage on semiconductor conductivity can be qualitatively described as follows: The electric field associated with the surface acoustic wave penetrates the semiconductor and modulates the carrier density near the semiconductor surface. This causes a net charge separation, the dc component of which gives rise to the acoustoelectric voltage. When the carrier density and, hence, the conductivity is low, it is obvious that the acoustoelectric voltage will be small. On the other hand, when the conductivity is large, the electric field will effectively be screened by carriers at the semiconductor surface. In this case, the acoustoelectric voltage is once again small. For some intermediate conductivity the electric field modulates the charge density substantially and the acoustoelectric voltage reaches a maximum. In addition, the sign of the transverse acoustoelectric voltage depends on the carrier type. That is, n-type semiconductors exhibit a positive transverse acoustoelectric voltage, and p-type semiconductors exhibit a negative transverse acoustoelectric voltage. The expected de- These results show that the unimplanted sample 1 exhibited a positive transverse acoustoelectric voltage as expected for n-type semiconductors as shown in FIG. 3. Furthermore, with application of bias voltage the surface conductivity of this sample could easily be changed from accumulation to depletion and inversion, and this be detected by relative change in the value and polarity of the transverse acoustoelectric voltage. The implanted but not - annealed sample type 2 exhibited a positive transverse acoustoelectric voltage and application of bias voltage resulted in no significant change in the value or polarity of transverse acoustoelectric voltage. This suggests that most of the implanted boron ions are not incorporated into electrically active sites and the implanted surface region is not p-type yet as reflected by the polarity of transverse acoustoelectric voltage. Furthermore, the insensitivity of this sample to bias voltage is an indication that the semiconductor surface potential is pinned by the implantation damage. The annealed sample type 3 showed a negative transverse acoustoelectric voltage as demonstrated by waveform 23 in FIG. 5. This reveals that the amount of annealing has been sufficient to electrically activate enough boron impurities to create p-type conductivity in the layer interacting with the surface acoustic wave. It was found that under illumination the transverse acoustoelectric voltage for this sample became positive again, as shown by waveform 24 of FIG. 5. This indicates that the surface acoustic wave interaction region reverted to n-type. The high density of hole electron pairs produced by the illumination would tend to greatly increase the recombination rate of holes in the thin implanted layer so that one can expect the n-type conductivity of the substrate to dominate. That the photogeneration of pairs is the mechanism involved is verified by the results shown by curves 26, 27, 28 in FIG. 6, which illustrates that the transverse acoustoelectric voltage sign change occurs only when the illumination photon energy approaches the bandgap energy of silicon.

Figure 7:
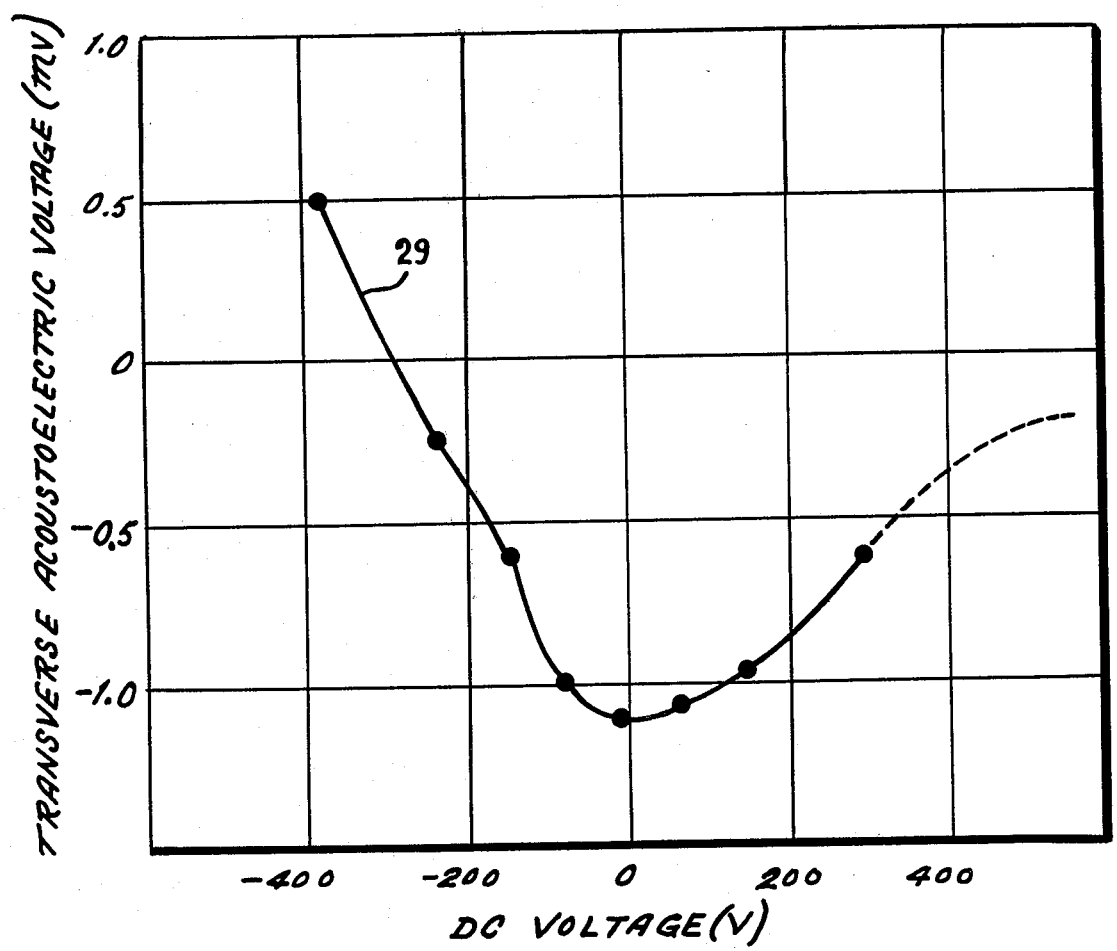

Application of bias voltage also affected the magnitude and polarity of the transverse acoustoelectric voltage for the case of the annealed sample type 3. Curve 29, FIG. 7 shows that as the conductivity of the surface is modulated by the applied dc bias, the transverse acoustoelectric voltage goes through a negative peak as predicted by FIG. 3. The sign of transverse acoustoelectric voltage is seen to change for a sufficiently large negative bias as expected. For the thicknesses and dielectric constants involved, this 300 V bias represents a drop of approximately 3 V across the depletion region of the silicon near the piezoelectric, which is a reasonable turn-on value to be expected for 9 ohm-cm n-type silicon with a $2 \times 10^{11}/cm^2$ p-type implant layer.

Sample type 4 which was annealed in the presence of steam exhibited a negative transverse acoustoelectric voltage which did not seem to be sensitive to illumination or bias voltage as shown in Table I. This behavior is caused by oxide growth on the silicon during the anneal cycle. Since the growth rate of steam oxide is quite fast at 1000° C., the silicon-silicon dioxide interface tends to be highly disordered and hence can be expected to have a large density of interface states. This results in pinning of the surface potential as verified by the insensitivity of transverse acoustoelectric voltage to bias conditions. Thus it can be seen that the transverse acoustoelectric voltage can be used not only as an indicator of the activation status of ion-implanted impurities in silicon, but also as an indicator of the anneal status of lattice damage.

While the invention has been described in one presently preferred embodiment it is understood that the words which have been used are words of description rather than words of limitation and that changes within the purview of the appended claims may be made without departing from the scope and spirit of the invention in its broader aspects.

What is claimed is:

1. A method for providing in-situ non-destructive monitoring of semiconductors during annealing process comprising the steps of
    affixing an electrical contact to the top surface of a semiconductor to be annealed,
    positioning a surface acoustic wave device having input and output transducers adjacent to said semiconductor, the surface acoustic wave propagating surface of said surface acoustic wave device being in close juxtaposed proximity to the bottom surface of said semiconductor,
    applying an r.f. input to said surface acoustic wave device input terminal,
    illuminating the bottom surface of said semiconductor through said surface acoustic wave device with radiant energy to effect annealing thereof, and
    measuring the transverse acoustoelectric voltage on said electrical contact, said transverse acoustoelectric voltage being a function of said semiconductor conductivity.

2. A method for providing in-situ non-destructive monitoring of semiconductors during annealing process as defined in claim 1 wherein a surface acoustic wave device having a substrate that is transparent to white and monochromatic radiation is used in the step of positioning a surface acoustic wave device adjacent to said semiconductor.

3. A method for providing in-situ non-destructive monitoring of semiconductors during annealing process as defined in claim 1 wherein a Y cut Z propagating lithium-niobate substrate type device is used in the step of positioning a surface acoustic wave device adjacent to said semiconductor.

4. A method for providing in-situ non-destructive monitoring of semiconductors during annealing process as defined in claim 3 including the step of applying a bias voltage to said electrical contact.

5. A method for providing in-situ non-destructive monitoring of semiconductors during annealing process as defined in claim 4 wherein said semiconductor is illuminated with white light radiation.

6. A method for providing in-situ non-destructive monitoring of semiconductors during annealing process as defined in claim 4 wherein said semiconductor is illuminated with monochromatic radiation.

7. A method for providing in-situ non-destructive monitoring of semiconductors during annealing process as defined in claim 6 wherein the semiconductor being annealed is a boron implanted silicon wafer.

* * * * *